(12) United States Patent
Totani et al.

(10) Patent No.: US 9,099,627 B2
(45) Date of Patent: Aug. 4, 2015

(54) METHOD FOR PRODUCING GROUP III NITRIDE SEMICONDUCTOR LIGHT-EMITTING DEVICE

(75) Inventors: Shingo Totani, Kiyosu (JP); Masashi Deguchi, Kiyosu (JP); Miki Moriyama, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 13/824,286

(22) PCT Filed: Jul. 12, 2011

(86) PCT No.: PCT/JP2011/003981
§ 371 (c)(1),
(2), (4) Date: Apr. 12, 2013

(87) PCT Pub. No.: WO2012/042713
PCT Pub. Date: Apr. 5, 2012

(65) Prior Publication Data
US 2013/0203194 A1 Aug. 8, 2013

(30) Foreign Application Priority Data

Sep. 28, 2010 (JP) .................................. 2010-216670
Jun. 7, 2011 (JP) .................................. 2011-126840

(51) Int. Cl.
*H01L 33/60* (2010.01)
*H01L 33/44* (2010.01)
(Continued)

(52) U.S. Cl.
CPC ................ *H01L 33/60* (2013.01); *H01L 33/44* (2013.01); *H01L 33/46* (2013.01); *H01L 33/38* (2013.01); *H01L 2933/0025* (2013.01)

(58) Field of Classification Search
None
See application file for complete search history.

(56) References Cited

U.S. PATENT DOCUMENTS 5,369,289 A * 11/1994 Tamaki et al. ................. 257/99
7,141,825 B2   11/2006 Horio et al.
(Continued)

FOREIGN PATENT DOCUMENTS

CN   101165928 A   4/2008
JP   2005-302747 A   10/2005
(Continued)

OTHER PUBLICATIONS

Taiwanese Office Action dated Oct. 17, 2013, with partial English translation.
(Continued)

*Primary Examiner* — Charles Garber
*Assistant Examiner* — Alia Sabur
(74) *Attorney, Agent, or Firm* — McGinn IP Law Group, PLLC

(57) ABSTRACT

Sample A is produced by sequentially forming a first insulating film of $SiO_2$ and a reflective film on a sapphire substrate. Sample B is produced by sequentially forming a first insulating film of $SiO_2$, a reflective film, and a second insulating film of $SiO_2$ on a sapphire substrate. In both samples A and B, the reflectance of the reflective film was measured at a wavelength of 450 nm before and after heat treatment. Heat treatment was performed at 600° C. for three minutes. As shown in FIG. 1, in Al/Ag/Al where Al has a thickness of 1 Å to 30 Å, Ag/Al where Al has a thickness of 20 Å, and Al/Ag/Al/Ag/Al where Al has a thickness of 20 Å, the reflectance was 95% or more, which is equivalent to or higher than that of Ag even after the heat treatment.

20 Claims, 12 Drawing Sheets

(51) Int. Cl.
*H01L 33/46* (2010.01)
*H01L 33/38* (2010.01)

(56) References Cited

U.S. PATENT DOCUMENTS

| | | | |
|---|---|---|---|
| 7,736,924 | B2 | 6/2010 | Song et al. |
| 7,737,456 | B2 | 6/2010 | Song et al. |
| 8,525,204 | B2 | 9/2013 | Fukshima et al. |
| 2004/0124422 | A1* | 7/2004 | Sakamoto et al. ............ 257/79 |
| 2005/0121685 | A1* | 6/2005 | Seong et al. ............... 257/99 |
| 2005/0211989 | A1 | 9/2005 | Horio et al. |
| 2006/0231852 | A1* | 10/2006 | Kususe et al. ............... 257/99 |
| 2007/0145396 | A1* | 6/2007 | Watanabe et al. ............ 257/98 |
| 2007/0295952 | A1 | 12/2007 | Jang et al. |
| 2008/0093617 | A1 | 4/2008 | Song et al. |
| 2008/0173885 | A1 | 7/2008 | Kuromizu |
| 2009/0269869 | A1* | 10/2009 | Song et al. .................. 438/29 |
| 2011/0018024 | A1 | 1/2011 | Fukshima et al. |
| 2011/0186860 | A1 | 8/2011 | Enya et al. |

FOREIGN PATENT DOCUMENTS

| | | | |
|---|---|---|---|
| JP | 2005302747 A | * | 10/2005 |
| JP | 2006-024750 A | | 1/2006 |
| JP | 2007-221029 A | | 8/2007 |
| JP | 2008-103674 A | | 5/2008 |
| JP | 2009-260316 A | | 11/2009 |
| JP | 2010-171142 A | | 8/2010 |
| KR | 10-0891833 B1 | | 4/2009 |
| TW | 2009-07124 A | | 2/2009 |
| TW | 201021255 A | | 6/2010 |
| WO | WO2009/119640 A1 | | 10/2009 |

OTHER PUBLICATIONS

International Search Report in PCT/JP2011/003981 dated Aug. 9, 2011 (English Translation Thereof).
Japanese Office Action dated May 13, 2014 with a partial English translation.
English translation of Korean Office Action dated Feb. 27, 2014.
Korean Office Action dated Feb. 27, 2015 with partial English translation thereof.
Chinese Office Action from the State Intellectual Property Office of People's Republic of China dated Apr. 20, 2015 with English Translation.

* cited by examiner

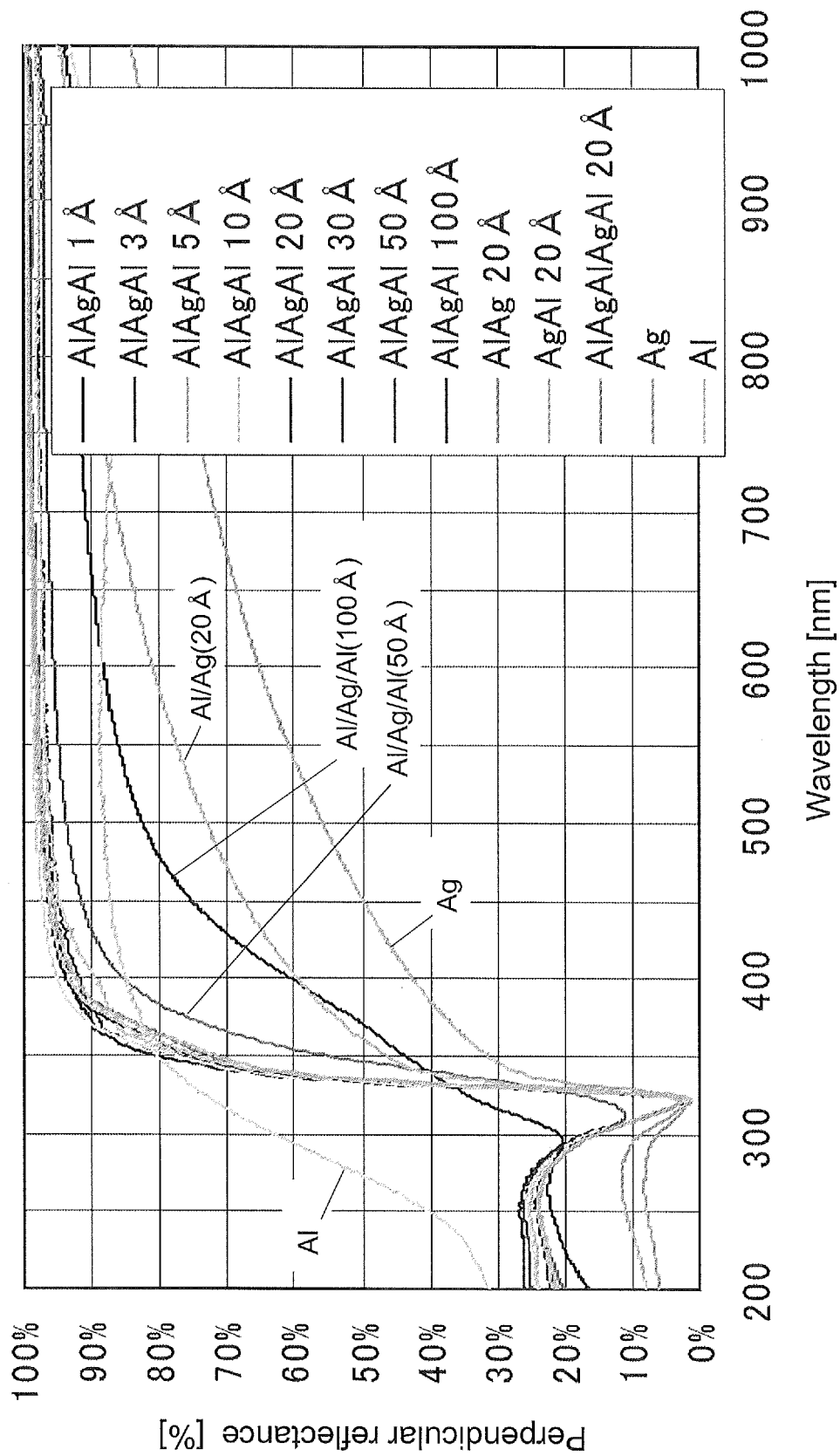

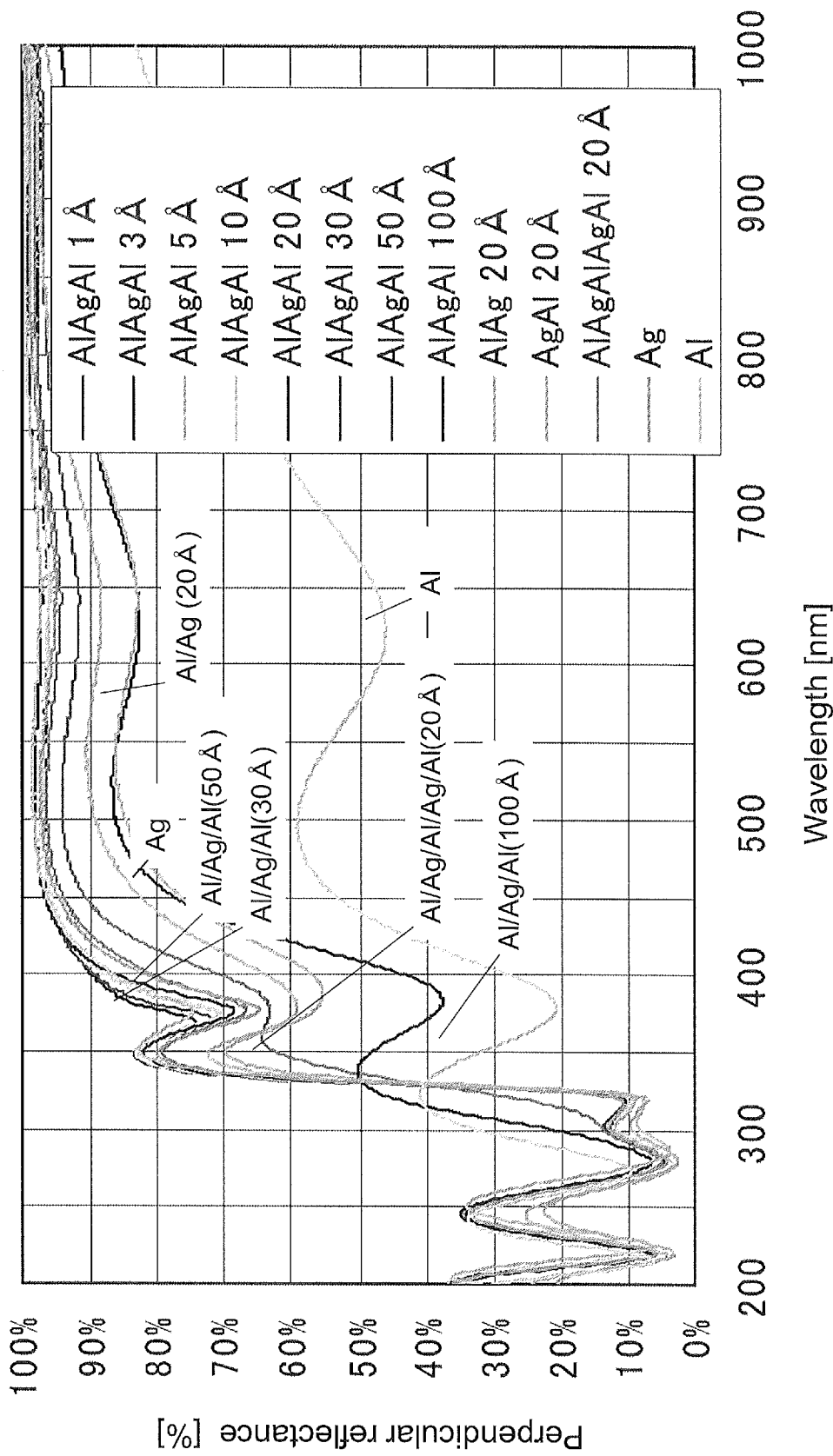

METHOD FOR PRODUCING GROUP III NITRIDE SEMICONDUCTOR LIGHT-EMITTING DEVICE

TECHNICAL FIELD

The present invention relates to a method for producing a Group III nitride semiconductor light-emitting device having a reflective film in contact with and on an insulator, wherein the heat resistance and reflectance of the reflective film are improved.

BACKGROUND ART

An Ag reflective film has been known to improve the light extraction performance of the Group III nitride semiconductor light-emitting device. However, Ag migration easily occurs. Therefore, Patent Document 1 discloses a structure in which the reflective film is sandwiched between the insulating films formed of $SiO_2$ so as to be electrically insulated, thereby suppressing migration. Moreover, the Ag reflective film has poor adhesion with the $SiO_2$ insulating film. To improve this, an adhesive layer formed of Ti, Ni, Al, W, and Mo having a thickness of 0.3 nm to 3 nm is formed between the reflective film and the insulating film. A conductive film made of a metal such as Al having a larger ionization tendency than Ag is formed on the reflective film, to thereby prevent migration in the reflective film.

Patent Document 2 discloses that an Ag alloy layer is formed, which functions both as an electrode on a p-type layer and a reflective layer of a light-emitting device. Specifically, a p-side electrode has a laminated structure in which a thin film, an Ag alloy layer, a barrier metal layer, and a p-side bonding layer are sequentially formed on a p-GaN layer. The thin film is formed to make a good ohmic contact with the p-GaN layer. The thin film is formed of Pt, Pd, Ni, or Co and has a thickness of 0.5 nm to 5 nm. The Ag alloy layer is formed of Ag alloy including at least one selected from the group consisting of Bi, Nd, Pd, and Mg or Ag alloy including at least one selected from the group consisting of PdCu, BiNd, NdAu, and NdCu. The Ag alloy layer has a thickness of 5 nm to 2000 nm, and functions as a light reflective layer. The barrier metal layer is formed of Ti, Mo, or Pt, or their alloy having a thickness of 10 nm to 200 nm. The barrier metal layer prevents a metal constituting the Ag alloy layer and a metal constituting the p-side bonding layer from diffusing each other. The p-side bonding layer is formed of Au. A technique disclosed in Patent Document 2 is to prevent reduction of reflectance as well as corrosion with a voltage applied even under high temperature and humidity and ion migration in the reflective layer by using the above Ag alloy as a reflective layer.

PRIOR ART DOCUMENTS

Patent Documents

Patent Document 1: Japanese Patent Application Laid-Open (kokai) No. 2005-302747
Patent Document 2: Japanese Patent Application Laid-Open (kokai) No. 2006-24750

SUMMARY OF THE INVENTION

Problems to be Solved by the Invention

Ag migration occurs by heat, thereby reducing the reflectance. Therefore, attention is required for heat history in the process after the formation of the reflective film. Patent Document 1 includes no description about migration by heat. Patent Document 2 suggests that no remarkable reduction of the reflectance was observed even after leaving for 100 hours at a temperature of 80° C. and a humidity of 90%. However, Patent Document 2 does not improve the reflectance by performing heat treatment at a higher temperature.

In view of the foregoing, an object of the present invention is to provide a method for producing a Group III nitride semiconductor light-emitting device having a reflective film, wherein heat resistance and reflectance of the reflective film are improved.

Means for Solving the Problems

In a first aspect of the present invention, there is provided a method for producing a Group III nitride semiconductor light-emitting device having a reflective film in contact with and on a first insulator, wherein the reflective film has at least two layers of a first layer and a second layer, the first layer is formed of Ag and then the second layer is formed of Al having a thickness of 1 Å to 30 Å on the first layer as the upper most layer. After the formation of the reflective film, heat treatment is performed at a temperature of 300° C. to 700° C.

The reflective film has an at least two-layer structure (including Ag/Al) of the first layer of Ag and the second layer of Al having a thickness of 1 Å to 30 Å formed on the first layer. The reflective film may have any structure as long as the second layer is the upper most layer (when the layer nearer to the first insulator is defined as a lower layer and the layer farther to the first insulator is defined as an upper layer). Particularly preferably, the reflective film has a three-layer structure of Al/Ag/Al in which the first layer and the second layer are sequentially formed on a third layer formed of Al having a thickness of 1 Å to 30 Å. When the thickness falls within this range, the reflective film exhibits higher reflectance by heat treatment than that when heat treatment is not performed. The reflectance of the present invention is about twice as high as that when the reflective film is formed of only Ag and heat treatment is performed. The second and third layers formed of Al may have different thicknesses. However, having the same thickness facilitates production, which is preferable. The first layer formed of Ag preferably has a thickness of 500 Å to 5000 Å. When the thickness is smaller than 500 Å, light transmittance is increased, which is not preferable. When the thickness is 5000 Å or more, a larger step is formed due to thickness, making it difficult to produce a device, which is not preferable. More preferably, the second layer of the reflective film has a thickness of 5 Å to 10 Å. When the reflective film has a three-layer structure, the thicknesses of the third layer and the second layer both fall within a range of 1 Å to 30 Å, as in the two-layer structure, the reflective film exhibits higher reflectance by heat treatment than that when heat treatment is not performed. Moreover, the reflectance of the present invention is about twice as high as that when the reflective film is formed of only Ag and heat treatment is performed.

The heat treatment is preferably performed at a temperature of 300° C. to 600° C. When the temperature falls within this range, the reflective film exhibits even higher reflectance. Heat treatment after the formation of the reflective film may be also aimed at such a forming of an ohmic contact electrode in the Group III nitride semiconductor light-emitting device or other purpose. The heat treatment within a temperature range of 300° C. to 600° C. can achieve an ohmic contact between the electrode and the semiconductor layer, that is, an ohmic contact with the electrode can also be achieved in the same heat treatment process. The heat treatment process may be performed any time after the formation of the reflective film. The heat treatment process may be performed at any time after the formation of the reflective film. The heat treatment process may be performed either before or after the reflective film is covered with the second insulator.

The first insulator may be formed of any insulating material such as $SiO_2$, $Si_3N_4$, $Al_2O_3$, and $TiO_2$ having transparency for the emission wavelength of the Group III nitride semiconductor light-emitting device. In the case of a face-up type device, the first insulator may be a growth substrate formed of an insulator, e.g. sapphire substrate.

A second aspect of the present invention is drawn to a specific embodiment of the production method according to the first aspect, wherein the reflective film has a three-layer structure in which a third layer is formed of Al having a thickness of 1 Å to 30 Å, and a first layer and a second layer are sequentially formed on the third layer. When Al total thickness in the three-layer structure is the same as Al thickness in the two-layer structure, the reflectance is more greatly improved by heat treatment in the three-layer structure than in the two-layer structure.

A third aspect of the present invention is drawn to a specific embodiment of the production method according to the first or second aspect, wherein the heat treatment is performed to form an ohmic contact with the electrode of the Group III nitride semiconductor light-emitting device. Since an ohmic contact with the electrode can be achieved in the same heat treatment process, the production process is simplified.

A fourth aspect of the present invention is drawn to a specific embodiment of the production method according to the first or second aspect, wherein the Group III nitride semiconductor light-emitting device has an n-type layer, a light-emitting layer, a p-type layer, and a diffusion electrode to diffuse a current to the p-type layer, and before the formation of the reflective film, contact electrodes are formed in contact with the n-type layer and the diffusion electrode, respectively. Here, the diffusion electrode is an electrode to uniformly diffuse a current to the p-type layer, in which a transparent conductive film such as a transparent metal thin film, ITO, titanium oxide, and tin oxide can be used.

A fifth aspect of the present invention is drawn to a specific embodiment of the production method according to the fourth aspect, wherein the heat treatment is performed with the top surface of the reflective film exposed after the formation of the reflective film, to also form an ohmic contact between the contact electrode and the n-type layer, between the contact electrode and the diffusion electrode, and between the diffusion electrode and the p-type layer. The increase rate of the reflectance of the reflective film is higher in the heat treatment with the top surface of the reflective film exposed than in the heat treatment with the top surface of the reflective film covered with the second insulator. Therefore, heat treatment under this condition has a greater improvement effect on reflectance.

A sixth aspect of the present invention is drawn to a specific embodiment of the production method according to the first to fourth aspect, wherein a second insulator is formed in contact with and on the reflective film, and heat treatment is performed after the formation of the second insulator.

The second insulator may be formed of any material having transparency for the emission wavelength of the Group III nitride semiconductor light-emitting device as in the first insulator. The first insulator and the second insulator may be formed of the same material or different materials.

A seventh aspect of the present invention is drawn to a specific embodiment of the production method according to the first to sixth aspect, wherein a barrier metal layer to prevent diffusion of Ag is formed on the reflective film. The barrier metal layer may be formed of at least one metal selected from the group consisting of Ti, Ni, Al, W, and Mo, an alloy including at least one or two meals or more selected from these metals, a metal having higher ionization tendency than Ag, or an n-type oxide conductive film such as ITO, IZO, and ICO. The barrier metal layer may have a layered structure in which the above materials are deposited. Ag migration due to humidity can be suppressed by providing the barrier metal layer.

A eighth aspect of the present invention is drawn to a specific embodiment of the production method according to the sixth aspect, wherein the Group III nitride semiconductor light-emitting device is a face-up type in which electrodes are formed in a wiring pattern on the second insulator, and light is extracted from the electrode side, and the reflective film is formed in regions facing to the electrodes in plan view (regions light-blocked by the electrodes). In this case, although light output is blocked by the electrodes formed in a wiring pattern, this light is reflected by the reflective film and output by multiple reflection at the positions where no electrode is formed in a wiring pattern, thereby improving light output efficiency.

A ninth aspect of the present invention is drawn to a specific embodiment of the production method according to the first to seventh aspect, wherein the Group III nitride semiconductor light-emitting device is a face-up type in which a substrate is the first insulator, and a device structure is formed thereon, and the reflective film is formed on the surface on the side opposite to the surface of the substrate on which the device structure is formed. That is, the present invention may provide a reflective film of the present invention on the rear surface of the substrate (surface on which the device layer is not formed) as well as a light-emitting device to prevent reduction of light output due to light blocking by the electrodes.

A tenth aspect of the present invention is drawn to a specific embodiment of the production method according to the first to seventh aspect, wherein the Group III nitride semiconductor light-emitting device is a flip-chip type in which a device structure is formed on a substrate and a reflective film is formed via the first insulator on the device structure. This can suppress reduction of light output due to light blocking by the electrodes.

A eleventh aspect of the present invention is drawn to a specific embodiment of the production method according to the first to tenth aspect, wherein the Group III nitride semiconductor light-emitting device has a peak emission wavelength of 400 nm or more. When the peak wavelength falls within a range of 400 nm or more, the reflectance of the reflective film can be increased to 90% or more in the device not having the second insulator, and the reflectance of the reflective film can be increased to 83% or more in the device having the second insulator. The reflective film of the present invention is effective for use in this wavelength range.

Effects of the Invention

The present invention can suppress reduction in the reflectance of the reflective film after heat treatment, and form the reflective film having a reflectance equivalent to or higher than that of Ag. As a result, the light extraction performance of the Group III nitride semiconductor light-emitting device can be improved. This is probably because Ag is passivated by Al, and thermal migration is prevented. Since Al has higher adhesion with an insulator such as $SiO_2$ than that of Ag, the adhesion between the reflective film and the insulator is ensured, thereby improving the reliability of the Group III nitride semiconductor light-emitting device.

As is clear from FIG. 1, the reflectance of the reflective film comprising a single Ag layer is reduced by heat treatment whether the top surface of Ag is covered with an insulating film or not. When the top surface of Ag is not covered with the insulating film, the reflectance is drastically reduced from 94.5% to 50%, decreased by 47%. Moreover, in the reflective film comprising a single Al layer, the reflectance is reduced by heat treatment whether the top surface of Al is covered with an insulating film or not. When the top surface of Al is covered with the insulating film, the reflectance is drastically reduced from 89% to 53.5%, decreased by 40%.

In contrast, in the present invention, when the reflective film is formed of Ag on the first insulator and Al thereon, and the top surface of Al is not covered with the second insulator, the reflectance of the reflective film is increased from 89% to 96.5%, increased by 8% by heat treatment. When the top surface of Al is covered with the second insulator, the reflectance of the reflective film is increased from 94.5% to 96.5%, increased by 2% by heat treatment. On the other hand, when the vertical sequence of Ag and Al is reversed, that is, the reflective film is formed of Al on the first insulator and Ag thereon, and the top surface of Ag is not covered with the second insulator, the reflectance of the reflective film is reduced from 96% to 67.5%, decreased by 30% by heat treatment. Moreover, when the top surface of Ag is covered with the second insulator, the reflectance of the reflective film is reduced from 83.5% to 82.5%, decreased by 1% by heat treatment. From this, it is understood that the existence of the Al layer on the Ag layer significantly contributes to the improvement in the reflectance of the reflective film by heat treatment.

When the reflective film has a three-layer structure of a third Al layer, a first Ag layer, and a second Al layer on the first insulator, the reflectance of the reflective film is increased by heat treatment whether the top surface of the second layer being the upper most layer is covered with the second insulator or not. When the thickness of the Al layer is 20 Å, the reflectance of the reflective film and its increase rate by heat treatment are almost same in both the three-layer structure of Al/Ag/Al and the two-layer structure of Ag/Al. This shows that the existence of the Al layer formed on the Ag layer contributes significantly to the improvement in the reflectance by heat treatment. Therefore, as is clear from FIG. 1, when the thickness of the Al layer (mainly the thickness of the Al layer (second layer) on the Ag layer) falls within a range of 1 Å to 30 Å, the reflectance is increased by heat treatment regardless of whether the reflective film has the three layer structure of Al/Ag/Al or the two-layer structure of Ag/Al.

The reflectance characteristics shown in FIG. 1 are when the reflective film was heat treated at a temperature of 600° C. in the device. FIG. 3 shows the reflectance characteristics of the reflective film formed of Al/Ag/Al when the heat treatment is not performed and when the heat treatment temperature was changed in both cases where the second layer is covered with the second insulator or not. In all cases when the heat treatment was performed, it is observed that the reflectance of the reflective film is increased. When the heat treatment was performed at a temperature of 300° C. to 600° C., the reflectance of the reflective film is certainly increased. When the heat treatment was performed at a temperature of 700° C., there is a tendency of increase or decrease depending on the thickness of the Al layer. When the heat treatment was performed at a temperature of 800° C., the reflectance is drastically reduced regardless of the thickness of the Al layer.

This shows that the heat treatment of the reflective film can be performed at a temperature of 300° C. to 700° C., preferably, 300° C. to 600° C.

BRIEF DESCRIPTION OF THE DRAWINGS

FIG. 2.B A schematic view showing the structure of the sample used for measurement of the reflectance.

FIG. 8.C A sketch showing a process for producing the Group III nitride semiconductor light-emitting device according to Embodiment 4.

FIG. 9 A graph showing the wavelength dependency of the reflectance.

FIG. 10 A graph showing the wavelength dependency of reflectance.

MODES FOR CARRYING OUT THE INVENTION

Specific embodiments of the present invention will next be described in detail with reference to the drawings. However, these embodiments should not be construed as limiting the present invention thereto.

Embodiment 1

Figure 2A:
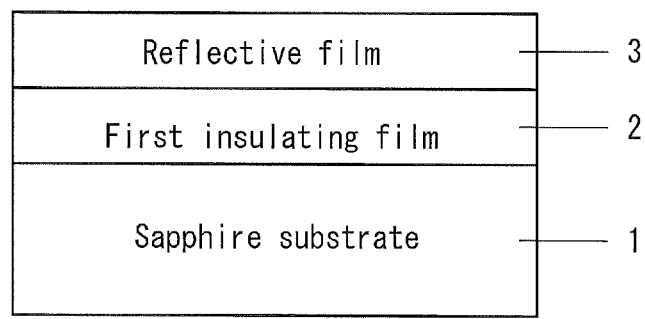
FIG. 2.A A schematic view showing the structure of the sample used for measurement of the reflectance.
Figure 2B:
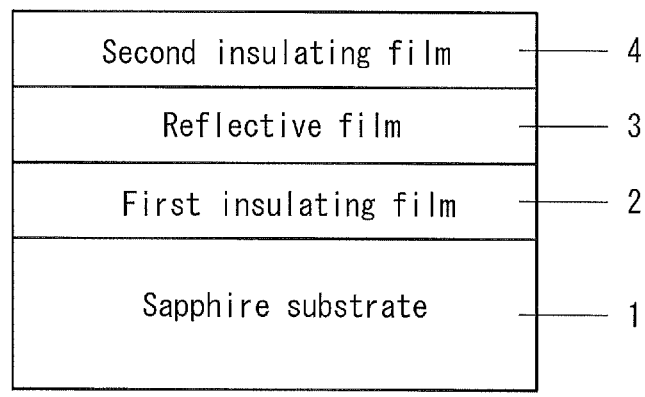

First, a first insulating film 2 (first insulator) formed of $SiO_2$ having a thickness of 3000 Å was formed on a sapphire substrate 1, and a reflective film 3 of various materials was formed through deposition on the first insulating film 2, thereby producing sample A (refer to FIG. 2A). Thereafter, the reflectance was measured by letting a light perpendicularly incident to a surface of the reflective film in both cases where the heat treatment was performed or not. Similarly as above, a first insulating film 2, and a reflective film 3 were sequentially formed on a sapphire substrate 1, and further a second insulating film 4 of $SiO_2$ (second insulator) having a thickness of 3000 Å was formed by CVD on the reflective film 3, thereby producing sample B (refer to FIG. 2B). Thereafter, the reflectance was measured in the same manner in both cases where the heat treatment was performed or not. Six types of materials were used as reflective films: Al/Ag/Al (means that an Al film, an Ag film, and an Al film were formed in this order on the first insulating film 2, hereinafter the same), Al/Ag, Ag/Al, Al/Ag/Al/Ag/Al, Ag, and Al. Each of Ag films has a thickness of 2000 Å. In the case of Al/Ag/Al, both Al films have the same thickness, and the reflectance was measured when the thickness of the Al film was 1 Å, 3 Å, 5 Å, 10 Å, 20 Å, 30 Å, 50 Å, and 100 Å. In the cases of Al/Ag, Ag/Al, and Al/Ag/Al/Ag/Al, the thickness of Al film is 20 Å. The single Ag layer has a thickness 2000 Å, and the single Al layer has a thickness of 1000 Å.

Figure 1:
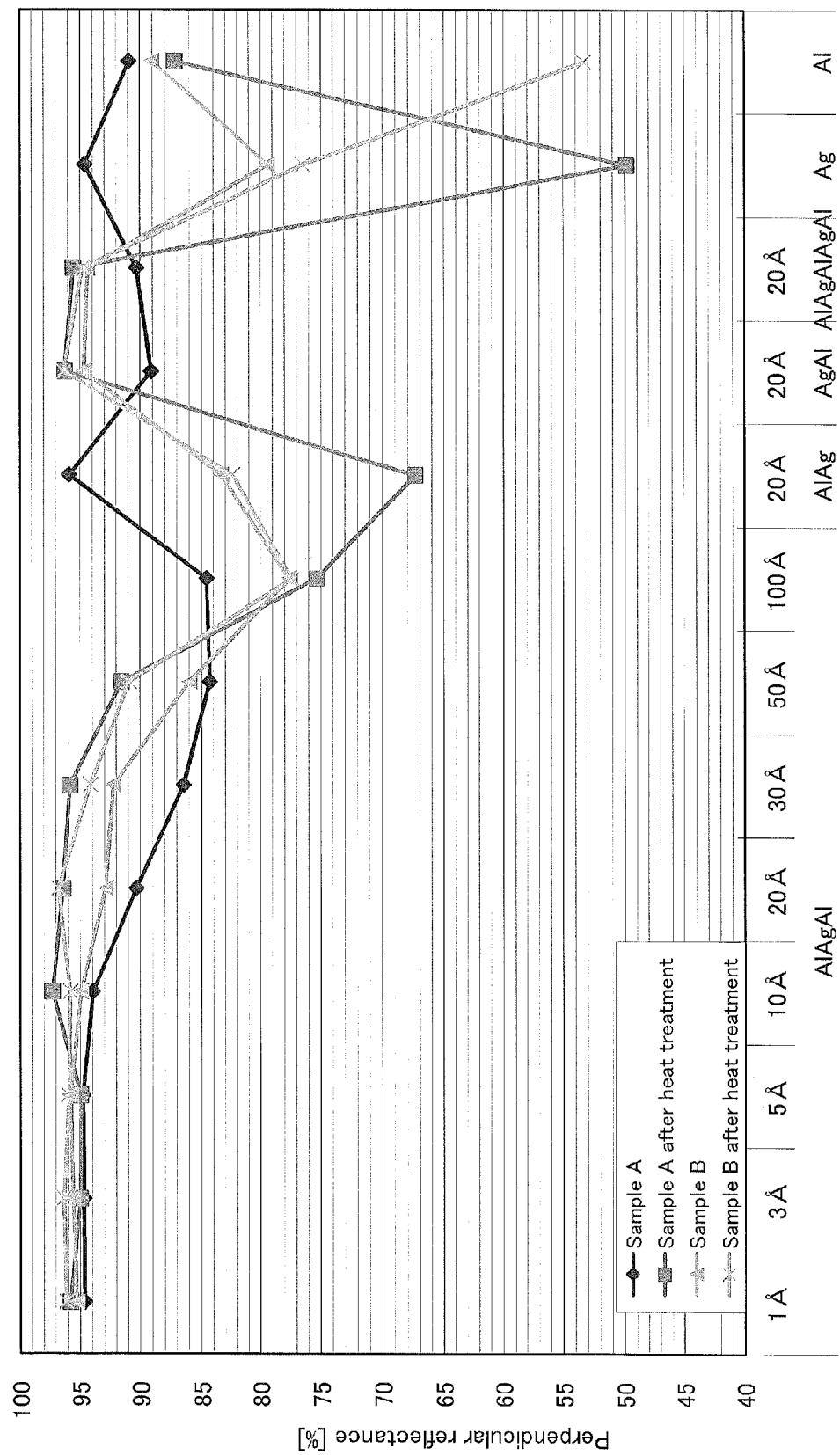
FIG. 1 A graph showing the relationship between the material and the reflectance of the reflective film.

FIG. 1 is a graph showing the relationship between the material of the reflective film and the reflectance at a wavelength of 450 nm. The heat treatment was performed for three minutes at 600° C.

As is observed from FIG. 1, when a single Ag layer or a single Al layer was used as a reflective film, the reflectance is more reduced in both samples A and B after heat treatment than before heat treatment. In the sample A using the single Ag layer, the reflectance of the reflective film is reduced by 47% by the heat treatment. In the sample B using the single Al layer, the reflectance of the reflective film is reduced by 40% by the heat treatment. In both cases, the reflectance is remarkably reduced. Moreover, in the sample A, the reflective film is exposed to an atmosphere during heat treatment. However, in the sample B, the reflective film is not exposed to an atmosphere during heat treatment. Therefore, the reduction of the reflectance by the heat treatment is not caused by exposure to an atmosphere during heat treatment.

On the other hand, when the Al thickness of Al/Ag/Al falls within a range of 1 Å to 30 Å, the reflectance is 95% or more after heat treatment in both samples A and B, which is equivalent to or higher than the reflectance of the single Ag layer before heat treatment. When the Al thickness of Ag/Al and Al/Ag/Al/Ag/Al is 20 Å, the reflectance after heat treatment is equivalent to or higher than the reflectance of the single Ag layer before heat treatment Therefore, it is assumed that when the reflective film has two layers of the Al layer and the Ag layer, the Al layer is formed as the upper most layer on and the thickness of the Al layer falls within a range of 1 Å to 30 Å, the reflectance equivalent to or higher than that of the single Ag layer can be obtained even after the heat treatment. When the thickness of the Al layer falls within a range of 1 Å to 30 Å, the reflectance is increased by the heat treatment in both samples A and B. This shows that the heat treatment is more effective in the improvement of the reflectance when the reflective film comprises a plurality of layers than when the reflective film comprises a single Ag layer.

Figure 3:
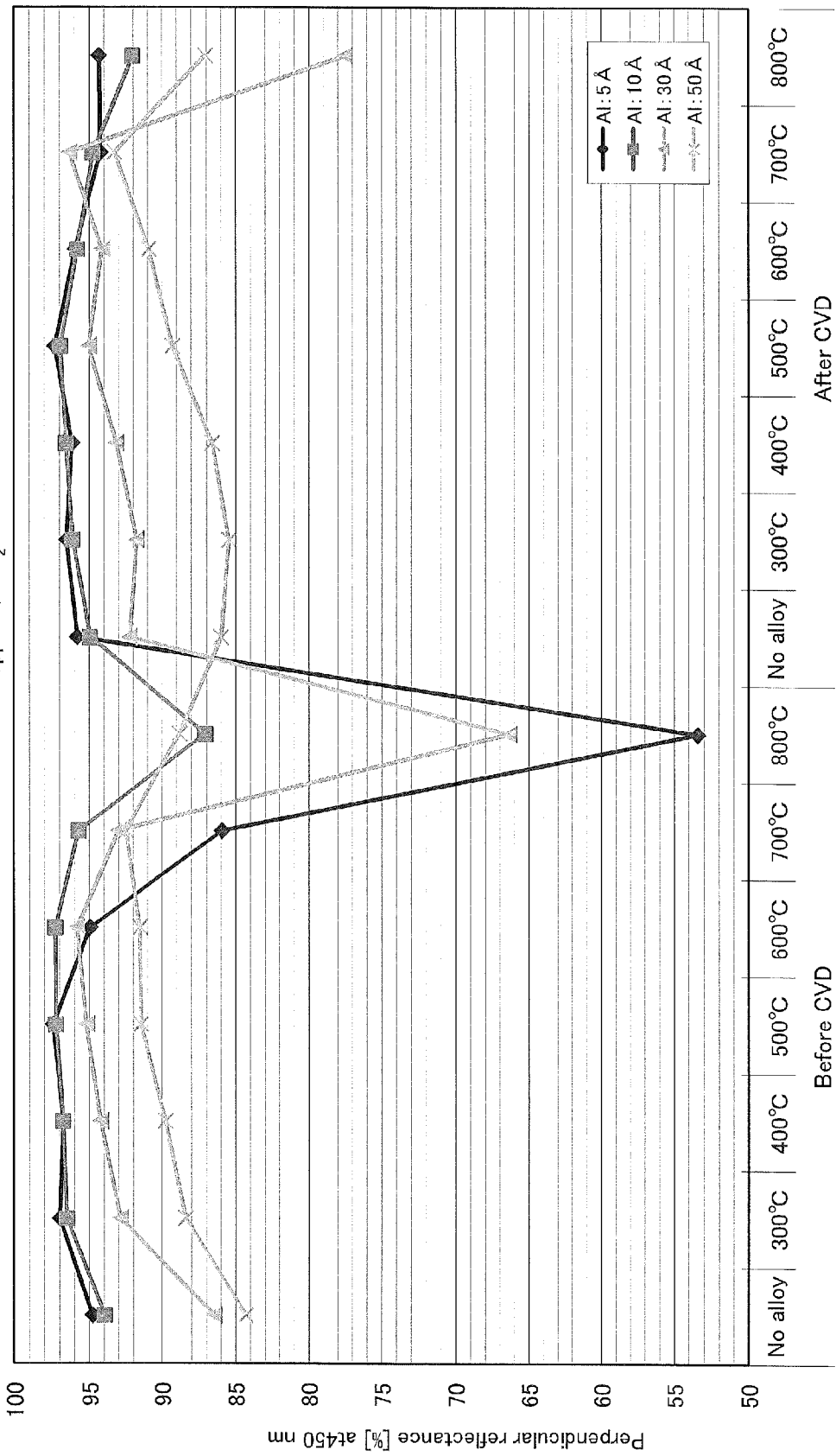
FIG. 3 A graph showing the relationship between the heat treatment temperature and the reflectance.

FIG. 3 is a graph showing the relationship between the heat treatment temperature and the reflectance at a wavelength of 450 nm. The heat treatment was performed for three minutes. Al/Ag/Al was used as a reflective film, and the Ag layer of Al/Ag/Al has a thickness of 2000 Å. The reflectance was measured when the thickness of the Al layer was 5 Å, 10 Å, 30 Å, and 50 Å. As is observed from FIG. 3, in both sample A in which the second insulating film 4 is not formed on the reflective film 3 and sample B in which the second insulating film 4 is formed on the reflective film 3, the reflectance is reduced when the heat treatment temperature was 800° C. Thus, the heat treatment temperature is preferably 300° C. to 700° C. When the heat treatment temperature falls within a range of 300° C. to 600° C., the higher the heat treatment, the higher the increasing rate of reflectance increase by heat treatment, regardless of the Al thickness. Therefore, the heat treatment temperature range of 300° C. to 600° C. has a special effect on the reflective film.

FIGS. 9 and 10 are graphs showing the wavelength dependency of the reflectance of the reflective film 3 in Samples A and B after heat treatment. As is clear from FIG. 9, in the sample A after heat treatment, when the reflective film 3 has an Al thickness of 1 Å to 30 Å, in the cases of Al/Ag/Al, Ag/Al, and Al/Ag/Al/Ag/Al, the reflectance is almost constant at 95% at a wavelength from 420 nm to 1000 nm. When the wavelength is shorter than 420 nm, the reflectance is also gradually reduced, and drastically reduced at a wavelength of 380 nm. As is clear from FIG. 10, in the sample B after heat treatment, when the reflective film 3 has an Al thickness of 1 Å to 30 Å, in the cases of Al/Ag/Al, Ag/Al, and Al/Ag/Al/Ag/Al, the reflectance is slightly reduced at a wavelength of 650 nm, but the reflectance is almost constant at 95% at a wavelength from 450 to 1000 nm. When the wavelength is shorter than 450 nm, the reflectance is gradually reduced. When the wavelength is shorter than 400 nm, the reflectance is reduced, showing a damped oscillation.

From the results given above, it was found that when the reflective film 3 comprises Al/Ag/Al, Ag/Al, or Al/Ag/Al/Ag/Al and the Al thickness is 1 Å to 30 Å in the production of the Group III nitride semiconductor light-emitting device having the reflective film on the insulating film, the heat treatment temperature after the formation of the reflective film is preferably 300° C. to 700° C. Thus, the reflectance of the reflective film 3 is equivalent to or higher than that of the single Ag layer before heat treatment, thereby improving the light extraction performance of the Group III nitride semiconductor light-emitting device. This is probably because Ag is passivated by Al, and thermal migration is prevented. Since Ag of the reflective film 3 is not in direct contact with the insulating film, the adhesion between the reflective film 3 and the insulating film is ensured, and the reliability of the Group III nitride semiconductor light-emitting device can also be improved. It was found from FIGS. 9 and 10 that when the above reflective film 3 is used, the peak emission wavelength of the Group III nitride semiconductor light-emitting device is preferably 400 nm or more, more preferably, 400 nm to 600 nm.

Embodiment 2

Figure 4:
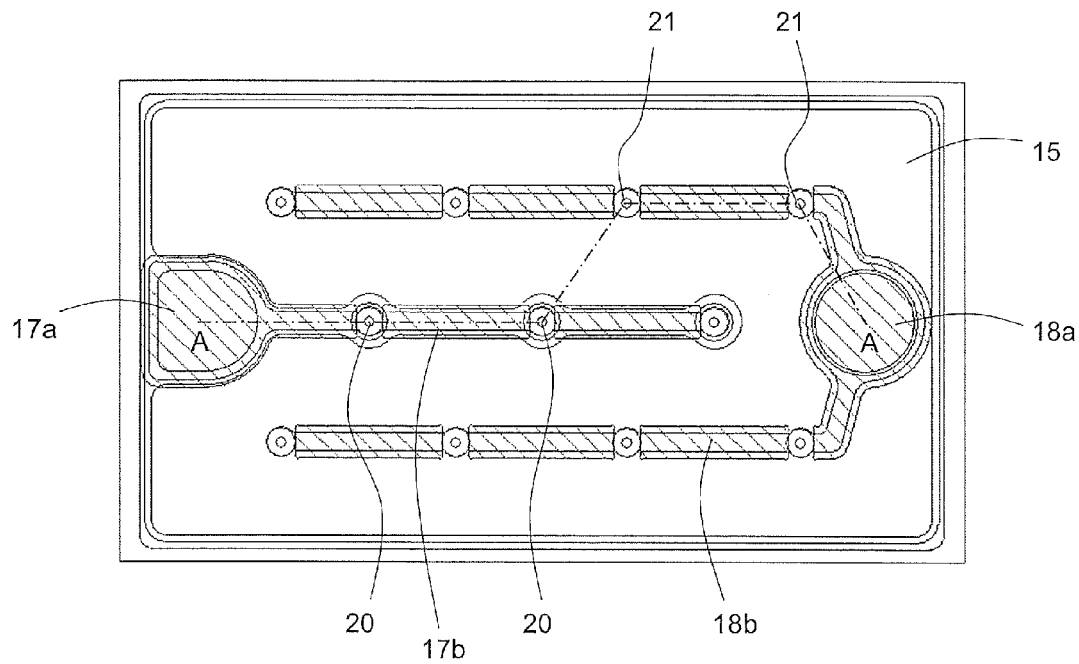
FIG. 4 A plan view of the Group III nitride semiconductor light-emitting device according to Embodiment 2.
Figure 5:
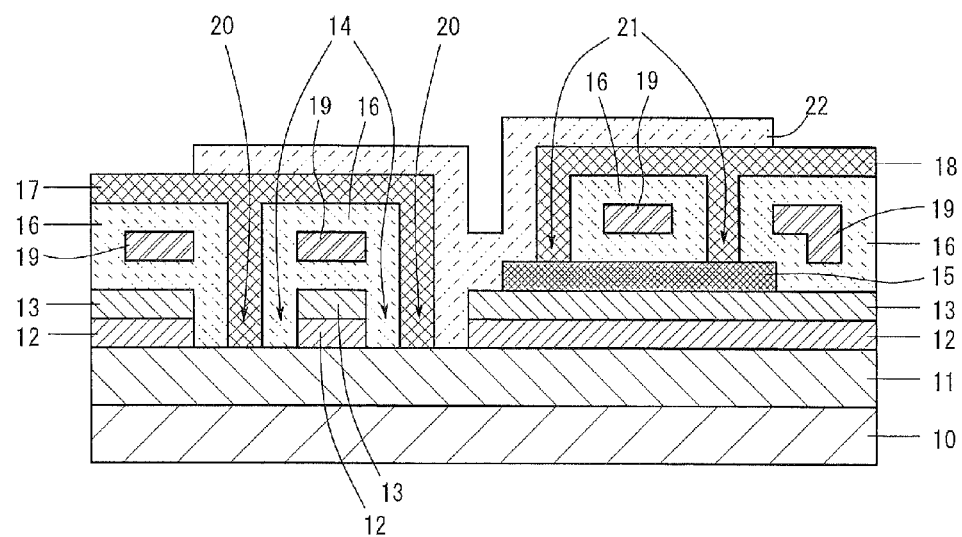
FIG. 5 A cross-sectional view of the Group III nitride semiconductor light-emitting device according to Embodiment 2.

FIG. 4 is a plan view of the Group III nitride semiconductor light-emitting device according to Embodiment 2. FIG. 5 is an A-A cross-sectional view of the plan view shown in FIG. 4.

As shown in FIG. 4, the Group III nitride semiconductor light-emitting device according to Embodiment 2 comprises a sapphire substrate 10, and an n-GaN layer 11, a light-emitting layer 12, and a p-GaN layer 13 formed in this order on the sapphire substrate 10. At the center of the surface of the p-GaN layer 13, a plurality of holes 14 having a depth extending from the surface of the p-GaN layer 13 to the n-GaN layer 11 are formed in a linear pattern. An ITO electrode 15 is formed on almost the entire surface other than the region provided with the holes 14 of the surface of the p-GaN layer 13. Moreover, an insulating film 16 formed of $SiO_2$ is provided so as to continuously cover the surface of the ITO electrode 15, the bottom and side surfaces of the holes 14, and the surfaces of the p-GaN layer 13 on which the ITO electrode 15 is not formed.

On the insulating film 16, an n-electrode 17 and a p-electrode 18 are formed. The n-electrode 17 comprises a pad portion 17a to which a bonding wire is connected and a wiring portion 17b continuous with the pad portion 17a. Similarly, the p-electrode 18 comprises a pad portion 18a and a wiring portion 18b continuous with the pad portion 18a. On the insulating film 16, holes 20 to expose the n-GaN layer 11 and holes 21 to expose the ITO electrode 15 are formed. The wiring portion 17b of the n-electrode 17 is in contact with the n-GaN layer 11 through the holes 20. The wiring portion 18b of the p-electrode 18 is in contact with the ITO electrode 15 through the holes 21.

In the insulating film 16, reflective films 19 are buried in regions facing the n-electrode 17 and the p-electrode 18 in plan view. The reflective film 19 has a three-layered structure of Al/Ag/Al where each Al has a thickness of 1 Å to 30 Å.

The Group III nitride semiconductor light-emitting device according to Embodiment 2 is of a face-up type in which light is extracted from the n-electrode 17 and the p-electrode 18. Here, the reflective films 19 buried in the insulating film 16 are positioned under the n-electrode 17 and the p-electrode 18. Therefore, those directed toward the n-electrode 17 and the p-electrode 18 of the lights emitted from the light-emitting layer 12 are reflected by the reflective film 19 and returned into the device. This prevents the light from being absorbed by the n-electrode 17 and the p-electrode 18. As a result, the light extraction performance is more improved than when the reflective film 19 is not formed.

Next will be described processes for producing the Group III nitride semiconductor light-emitting device according to Embodiment 2 with reference to FIG. 6.

Figure 6A:
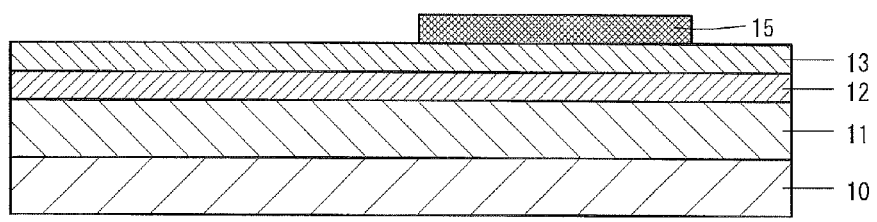
FIG. 6A A sketch showing a process for producing the Group III nitride semiconductor light-emitting device according to Embodiment 2.

Firstly, an n-GaN layer 11, a light-emitting layer 12, and a p-GaN layer 13 are sequentially formed on a sapphire substrate 10 by MOCVD. The raw material gases employed for MOCVD are as follows: TMG (trimethylgallium) as a Ga source, TMI (trimethylindium) as an In source, TMA (trimethylaluminum) as an Al source, ammonia as a nitrogen source, silane as an n-type doping gas, cyclopentadienylmagnesium as a p-type doping gas, and hydrogen or nitrogen as a carrier gas. Then, an ITO electrode 15 is formed by vapor deposition on a portion of the p-GaN layer 13 (FIG. 6A).

Figure 6B:
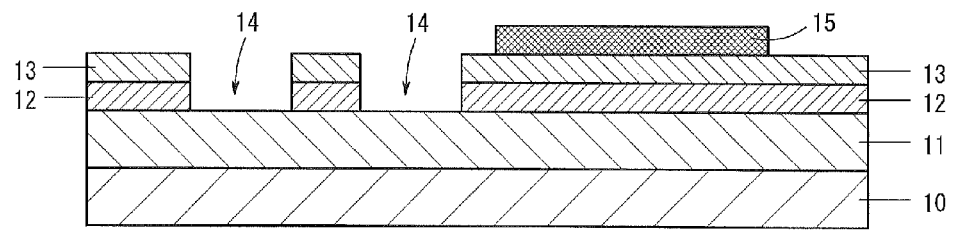
FIG. 6B A sketch showing a process for producing the Group III nitride semiconductor light-emitting device according to Embodiment 2.

Subsequently, holes 14 having a depth extending from the surface of the p-GaN layer 13 to the n-GaN layer 11 are formed by photolithography and dry etching (FIG. 6B).

An ITO electrode 15 may be formed after the holes 14 were formed.

Figure 6C:
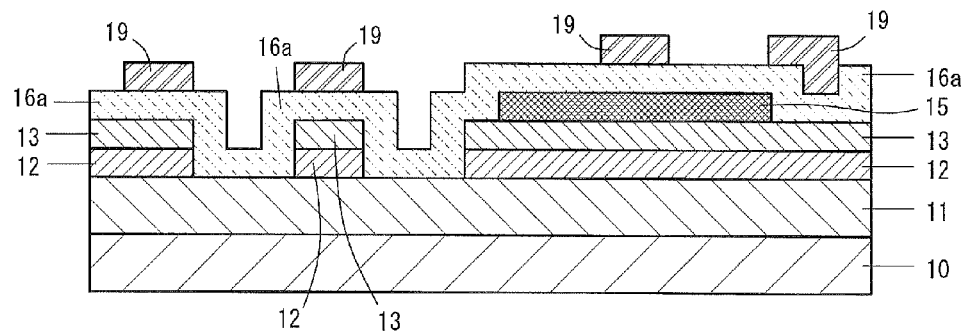
FIG. 6C A sketch showing a process for producing the Group III nitride semiconductor light-emitting device according to Embodiment 2.

Next, a first insulating film 16a formed of $SiO_2$ is deposited by MOCVD so as to continuously cover the entire top surface, i.e., the surface of the ITO electrode 15, the bottom surfaces and side surfaces of the holes 14, and the surfaces of the p-GaN layer 13 on which the ITO electrode 15 is not formed. On regions facing the n-electrode 17 and the p-electrode 18 to be formed later in plan view on the first insulating film 16a, an Al film, an Ag film, and an Al film are sequentially deposited by sputtering, to thereby form a reflective film 19 of Al/Ag/Al (FIG. 6C). Besides Ar gas, Ar gas added with oxygen (e.g. one volume percentage of oxygen was added) may be used as a sputtering gas. The Al film has a thickness of 1 Å to 30 Å. The Ag film has a thickness of 500 Å to 5000 Å.

Figure 6D:
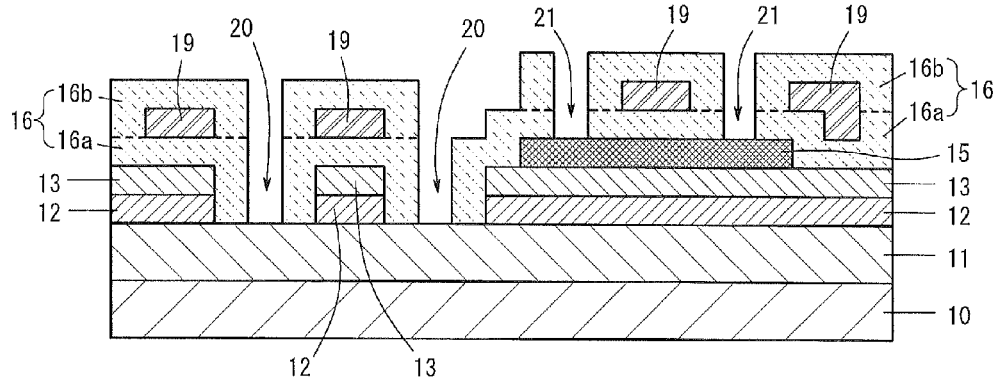
FIG. 6D A sketch showing a process for producing the Group III nitride semiconductor light-emitting device according to Embodiment 2.

Subsequently, a second insulating film 16b of $SiO_2$ is formed by MOCVD so as to continuously cover the surface of the first insulating film 16a and the surfaces of the reflective films 19. Thus, the first insulating film 16a and the second insulating film 16b are integrated into an insulating film 16. In the insulating film 16, a reflective film 19 is formed so as to be buried in regions facing the n-electrode 17 and the p-electrode 18 to be formed later in plan view. Thereafter, holes 20 to expose the n-GaN layer 11 and holes 21 to expose the ITO electrode 15 are formed on specific regions of the insulating film 16 (FIG. 6D).

Figure 6E:
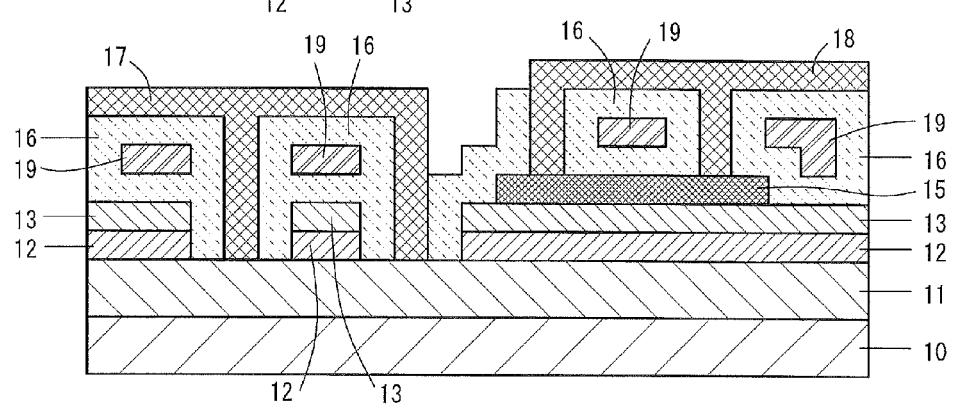
FIG. 6E A sketch showing a process for producing the Group III nitride semiconductor light-emitting device according to Embodiment 2.

Next, an n-electrode 17 and a p-electrode 18 of Ni/Au/Al are formed by vapor deposition on the insulating film 16. The n-electrode 17 and the p-electrode 18 may be separately formed or may be simultaneously formed using the same material. The n-electrode 17 is formed in a shape having a pad portion 17a and a wiring portion 17b, and the holes 20 are filled with a portion of the wiring portion 17b so that the wiring portion 17b is in contact with the n-GaN layer 11. The p-electrode 18 is formed in a shape having a pad portion 18a and a wiring portion 18b, and the holes 21 are filled with a portion of the wiring portion 18b so that the wiring portion 18b is in contact with the ITO electrode 15 (FIG. 6E).

Secondly, the heat treatment is performed for three minutes at a temperature of 300° C. to 700° C. This is performed to form an ohmic contact between the n-electrode 17 and the n-GaN layer 1, between the p-electrode 18 and the ITO electrode 15, and between the ITO electrode 15 and the p-GaN layer 13. Thereafter, an insulating film 22 is formed on the entire surface except for the pad portion 17a of the n-electrode 17 and the pad portion 18a of the p-electrode 18. Thus, the Group III nitride semiconductor light-emitting device according to Embodiment 2 shown in FIGS. 4 and 5 is produced.

In the above method for producing the Group III nitride semiconductor light-emitting device according to Embodiment 2, the reflective film 19 is formed of Al/Ag/Al where Al has a thickness of 1 Å to 30 Å, and the heat treatment after the formation of the reflective film 19 is performed at a temperature range of 300° C. to 700° C. Therefore, the reflectance of the reflective film 19 is equivalent to or higher than that of the single Ag layer even after heat treatment. The Group III nitride semiconductor light-emitting device according to Embodiment 2 exhibits superior light extraction performance. Since Ag of the reflective film 19 is not direct contact with the insulating film 16, the adhesion between the reflective film 19 and the insulating film 16 is ensured and the reliability of the Group III nitride semiconductor light-emitting device is also improved.

Embodiment 3

Figure 7:
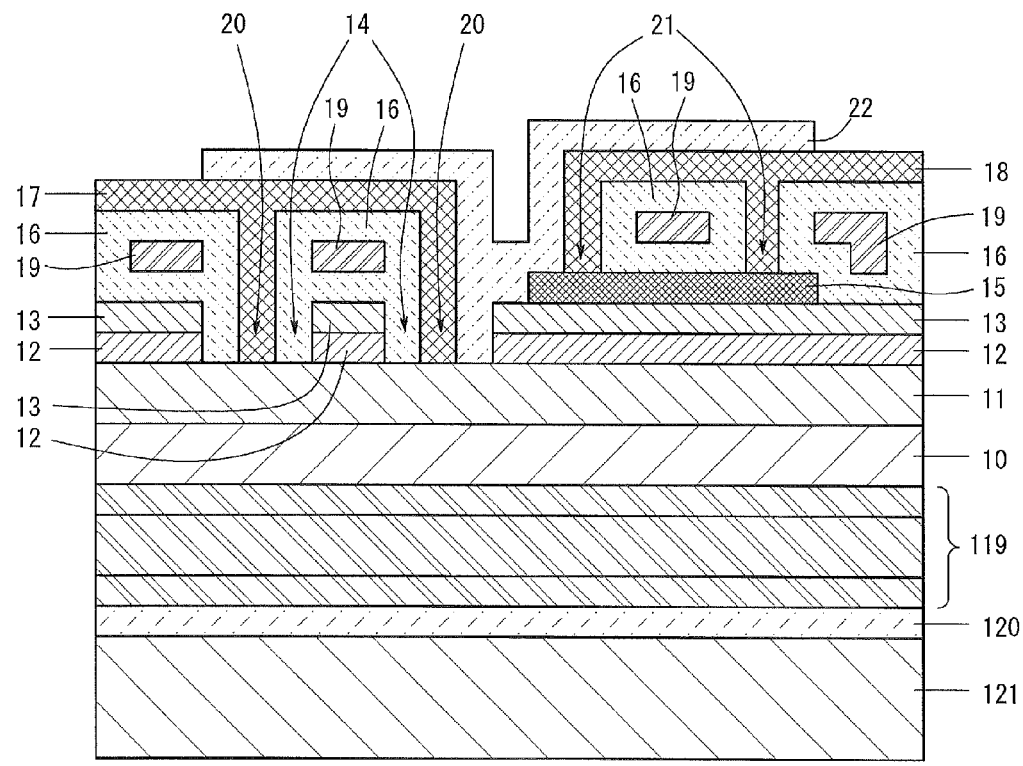
FIG. 7 A cross-sectional view of the Group III nitride semiconductor light-emitting device according to Embodiment 3.

FIG. 7 shows a cross-sectional view of the structure of the Group III nitride semiconductor light-emitting device according to Embodiment 3. The Group III nitride semiconductor light-emitting device according to Embodiment 3 comprises a reflective film 119, an insulating film 120 of $SiC_2$, and a solder layer 121 sequentially formed on the bottom surface of the sapphire substrate 10 (the side opposite to the surface having the n-GaN layer 11) of the Group III nitride semiconductor light-emitting device according to Embodiment 2. The reflective film 119 has the same structure of the reflective film 19 and comprises Al/Ag/Al. The respective Al has a thickness of 1 Å to 30 Å, and Ag has a thickness of 500 Å to 5000 Å. The solder layer 121 is formed of Au or AuSn.

The Group III nitride semiconductor light-emitting device according to Embodiment 3 is a face-up type device where light is extracted from the n-electrode 17 and the p-electrode 18 as in the Group III nitride semiconductor light-emitting device according to Embodiment 2. The reflective film 119 reflects a light emitted from the light-emitting layer 12 to the sapphire substrate 10 to the light extraction surface side. When this Group III nitride semiconductor light-emitting device is connected to a lead frame via the solder layer 121, the reflective film 119 has the reflectance equivalent to or higher than that of the single Ag layer at a heat treatment temperature of 300° C. to 700° C. As a result, the Group III nitride semiconductor light-emitting device according to Embodiment 3 is extremely superior in light extraction performance.

Embodiment 4

Next will be described processes for producing the Group III nitride semiconductor light-emitting device according to Embodiment 4 with reference to FIG. 8.

Figure 8A:
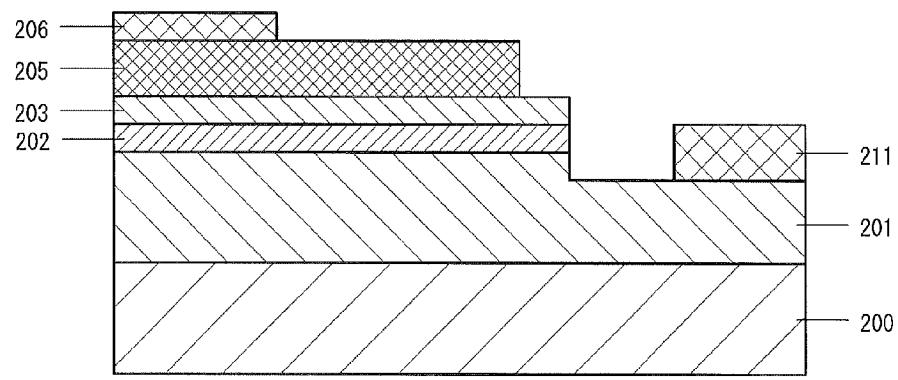
FIG. 8A A sketch showing a process for producing the Group III nitride semiconductor light-emitting device according to Embodiment 4.

Firstly, an n-GaN layer 201, a light-emitting layer 202, and a p-GaN layer 203 are sequentially formed on a sapphire substrate 200 by MOCVD on a sapphire substrate 200. An ITO electrode 205 is formed on a portion of the p-GaN layer 203. Subsequently, portions of the light-emitting layer 202 and the p-GaN layer 203 are removed by photolithography and dry etching, to thereby expose the n-GaN layer 201. An ITO contact electrode 206 of Ni/Al/Au is formed on a portion of the ITO electrode 205, and an n contact electrode 211 of Ni/Au/Al is formed on a portion of the exposed n-GaN layer 201 (FIG. 8A).

Secondly, the heat treatment is performed for three minutes at a temperature of 300° C. to 700° C. This is performed to form an ohmic contact between the n contact electrode 211 and the n-GaN layer 201, between the ITO contact electrode 206 and the ITO electrode 205, and between the ITO electrode 205 and the p-GaN layer 203.

Figure 8B:
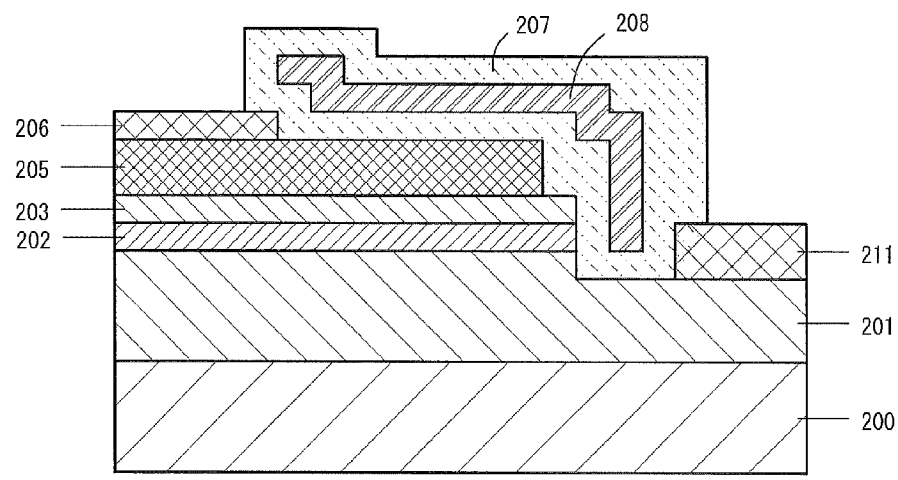
FIG. 8.B A sketch showing a process for producing the Group III nitride semiconductor light-emitting device according to Embodiment 4.

Subsequently, an insulating film 207 of $SiO_2$ is formed so as to continuously cover the surface of the ITO electrode 205, the surface of the ITO contact electrode 206, the exposed n-GaN layer 201, and the side surface and the top surface of the n contact electrode 211. On the insulating film 207, a reflective film 208 is formed in a region positioned not above the ITO contact electrode 206 and the n contact electrode 211 in plan view. The reflective film 208 is formed of Al/Ag/Al where each Al has a thickness of 1 Å to 30 Å. Further, an insulating film is formed so as to continuously cover the surface on the insulating film 207 and the reflective film 208, to thereby provide a structure where the reflective film 208 is buried in the insulating film 207. The ITO contact electrode 206 and the n contact electrode 211 are exposed by etching a part of the insulating film 207 (FIG. 8B).

Figure 8C:
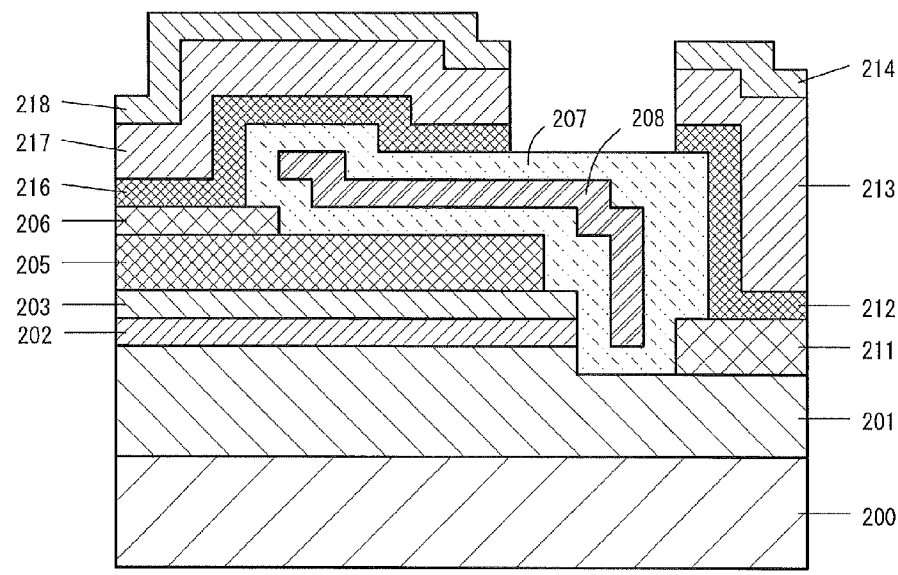

Subsequently, a barrier electrode 216 of Ti/Ni, an AuSn solder layer 217, and an Au layer 218 are sequentially formed on the exposed ITO contact electrode 206. A barrier electrode 212 of Ti/Ni, an AuSn solder layer 213, and an Au layer 214 are sequentially formed on the exposed n contact electrode 211 (FIG. 8C).

The Group III nitride semiconductor light-emitting device according to Embodiment 4 produced through the above process is of a flip-chip type in which light is extracted from the backside of the sapphire substrate 200 (the side opposite to the surface having the n-GaN layer 201). A light emitted from the light-emitting layer 202 to the side opposite to the light extraction surface can be reflected to the light extraction surface side by the reflective film, thereby improving the light extraction performance. Since Al/Ag/Al where Al has a thickness of 1 Å to 30 Å is used as a material of the reflective film 208, and the heat treatment is performed at a temperature of 300° C. to 700° C. after the formation of the reflective film 208, the reflectance of the reflective film 208 is equivalent to or higher than that of the single Ag layer. Therefore, the Group III nitride semiconductor light-emitting device according to Embodiment 4 is superior in light extraction performance. Moreover, since Ag is not in direct contact with the insulating film 207 in the reflective film 208, the adhesion between the reflective film 208 and the insulating film 207 is ensured, and the reliability of the Group III nitride semiconductor light-emitting device is improved.

Embodiment 5

Figure 11:
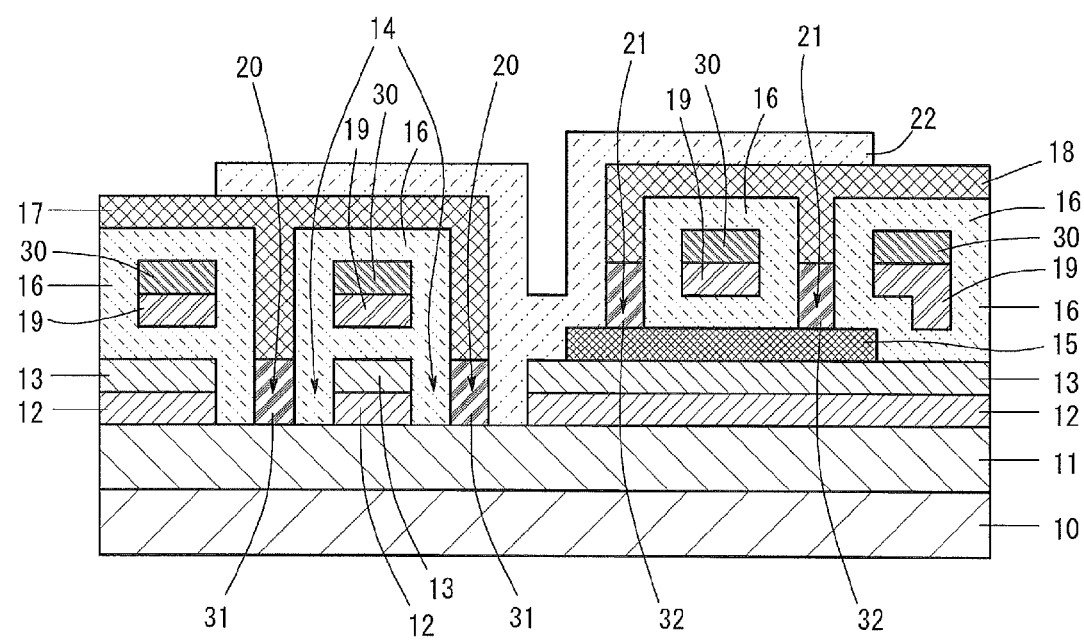
FIG. 11 A cross-sectional view of the Group III nitride semiconductor light-emitting device according to Embodiment 5.

Next will be described processes for producing the Group III nitride semiconductor light-emitting device according to Embodiment 5. FIG. 11 is a cross-sectional view of the Group III nitride semiconductor light-emitting device produced by the production method according to Embodiment 5. The plan view is the same as FIG. 4, and FIG. 11 is a cross-sectional view along the A-A line in FIG. 4. The same reference numbers are assigned to the portions having the same function as in Embodiment 2.

As shown in FIG. 11, the Group III nitride semiconductor light-emitting device according to Embodiment 5 has the similar shape as that of the Group III nitride semiconductor light-emitting device according to Embodiment 2 shown in FIG. 5. The differences between them are as follows: contact electrodes 31 and contact electrodes 32 are formed in contact with the n-GaN layer 11 and the ITO electrode 15, respectively. The n-electrode 17 formed on the insulating film 16 is in contact with the contact electrodes 31, and the p-electrode 18 formed on the insulating film 16 is in contact with the contact electrode 32. The contact electrode 31 is a circular dot-shaped electrode discretely formed at a plurality of positions in contact with and on the n-GaN layer 11. Similarly, the contact electrode 32 is a circular dot-shaped electrode discretely formed at a plurality of positions in contact with and on the ITO electrode 15 (diffusion-electrode). On the reflective film 19, a barrier metal layer 30 is formed so as to have the same shape and area as that of the reflective film 19. The barrier metal layer 30 is formed of Ti having a thickness of 1000 Å. Only these points are different from the structure of the Group III nitride semiconductor light-emitting device according to Embodiment 2.

The barrier metal layer 30 may be formed of at least one metal selected from the group consisting of Ti, Ni, Al, W, and Mo, an alloy including at least one or two meals or more selected from these metals, a metal having higher ionization tendency than Ag, or an n-type oxide conductive film such as ITO, IZO, and ICO. The barrier metal layer 30 may comprise a single layer or a plurality of layers of the above different metals. The barrier metal layer 30 preferably has a thickness of 300 Å to 5000 Å. When the thickness is 5000 Å or more, the barrier metal layer 30 is difficult to be covered with the insulating film 16, which is not preferable. When the thickness is 300 Å or less, the barrier metal layer 30 is not formed in a film, which is not preferable. More preferably, the thickness is 500 Å to 2000 Å.

Figure 12A:
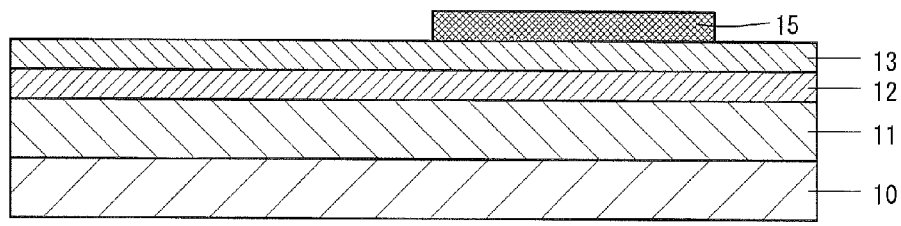
FIG. 12A A sketch showing a process for producing the Group III nitride semiconductor light-emitting device according to Embodiment 5.
Figure 12B:
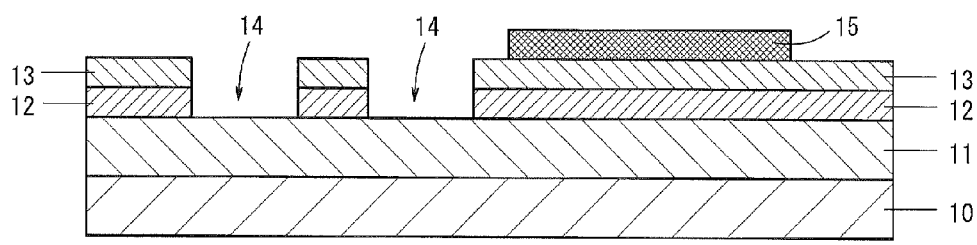
FIG. 12B A sketch showing a process for producing the Group III nitride semiconductor light-emitting device according to Embodiment 5.

Next will be described processes for producing the Group III nitride semiconductor light-emitting device according to Embodiment 5. As shown in FIG. 12A, an n-GaN layer 11, a light-emitting layer 12, and a p-GaN layer 13 are sequentially formed by MOCVD on a sapphire substrate 10. An ITO electrode 15 is formed by vapor deposition on a portion of the p-GaN layer 13. This process is the same as that of FIG. 6A in Embodiment 2. Subsequently, as shown in FIG. 12B, holes 14 having a depth extending from the surface of the p-GaN layer 13 to the n-GaN layer 11 are formed by dry etching after the formation of a mask by applying photo resist, exposing, and developing. This process is the same as that of FIG. 6B in Embodiment 2. The ITO electrode 15 may be formed after the holes 14 were formed.

Figure 12C:
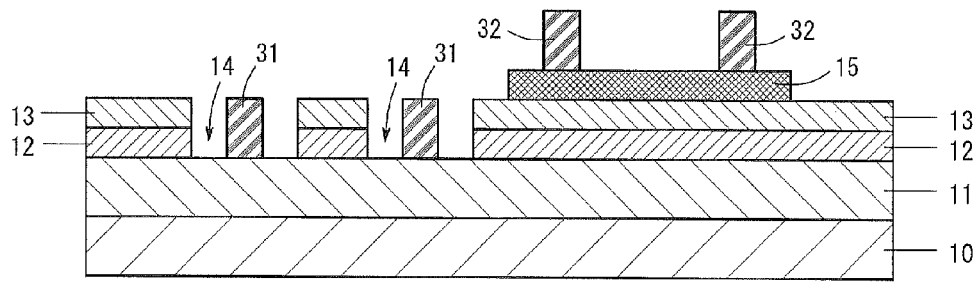
FIG. 12C A sketch showing a process for producing the Group III nitride semiconductor light-emitting device according to Embodiment 5.

After photoresist was applied to the entire surface, a circular dot-shaped portion is exposed and developed in a specified region, to thereby form a mask having circular dot-shaped windows. Thereafter, Ni, Au, and Al are deposited in this order, and the mask is lifted off. As shown in FIG. 12C, contact electrodes 31 having a structure of Ni/Au/Al is formed on the exposed surface of the n-GaN layer 11 in the holes. That is, the contact electrodes 31 are in contact with the n-GaN layer 11 in a circular dot pattern at a plurality of positions. Similarly, as shown in FIG. 12C, contact electrodes 32 having a layered structure of Ni/Au/Al are formed on the surface of the ITO electrode 15. That is, the contact electrodes 32 are in contact with the ITO electrode 15 in a circular dot pattern at a plurality of positions.

Figure 12D:
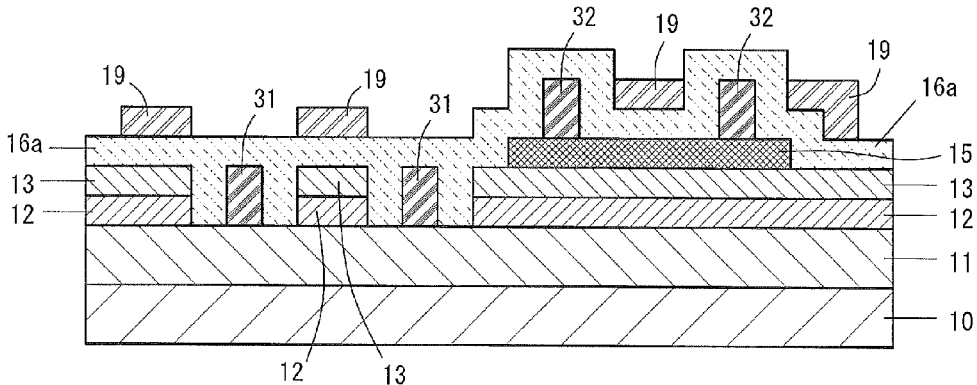
FIG. 12D A sketch showing a process for producing the Group III nitride semiconductor light-emitting device according to Embodiment 5.

Next, as shown in FIG. 12D, a first insulating film 16a formed of $SiO_2$ is formed by MOCVD so as to continuously cover the entire top surface, i.e., the exposed surface of the ITO electrode 15, the exposed surfaces of the contact electrodes 31 and 32, the bottom surfaces and side surfaces of the holes 14, and the exposed surface of the p-GaN layer 13. On the insulating film 16a, a reflective film 19 of Al/Ag/Al is formed by depositing an Al film, an Ag film, and Al film in this order through sputtering in regions facing the n-electrode 17 and the p-electrode 18 to be formed later in plan view (regions light-blocked by the n-electrode 17 and the p-electrode 18). This process is the same as that of FIG. 6C in Embodiment 2. Same as in Embodiment 2, the Al film has a thickness of 1 Å to 30 Å, and the each Ag film has a thickness of 500 Å to 5000 Å.

Secondly, with this condition, the heat treatment is performed at a temperature of 300° C. to 700° C. for three minutes. This is performed to form an ohmic contact between the contact electrode 31 and the n-GaN layer 11, between the contact electrode 32 and the ITO electrode 15, and between the ITO electrode 15 and the p-GaN layer 13.

Figure 12E:
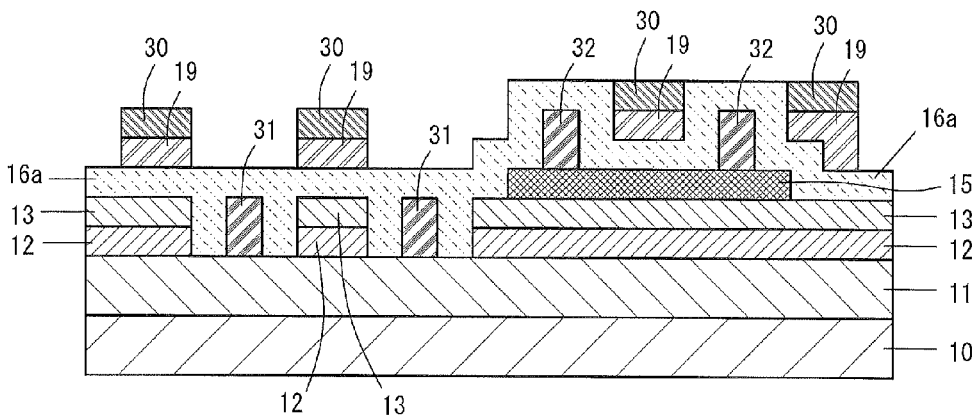
FIG. 12E A sketch showing a process for producing the Group III nitride semiconductor light-emitting device according to Embodiment 5.

Subsequently, as shown in FIG. 12E, a mask was formed by applying photoresist, exposing, and developing. On the reflective film 19, a barrier metal layer 30 is formed by sputtering so as to have the same shape and area as that of the reflective film 19. The barrier metal layer 30 is formed so that Ti has a thickness of 400 nm.

Figure 12F:
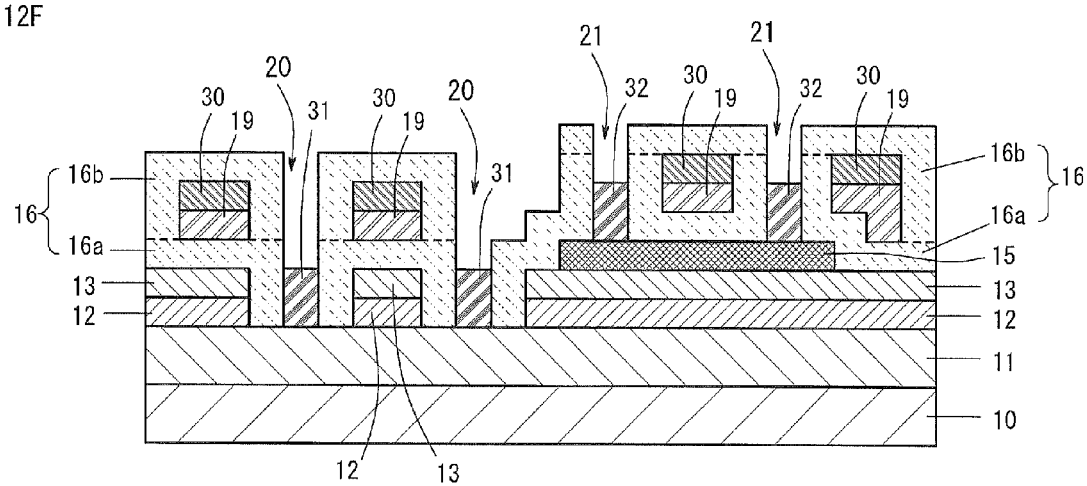
FIG. 12F A sketch showing a process for producing the Group III nitride semiconductor light-emitting device according to Embodiment 5.

As shown in FIG. 12F, a second insulating film 16b of $SiO_2$ is formed by MOCVD so as to continuously cover the surface of the first insulating film 16a and the surface of the reflective film 19. Thus, the first insulating film 16a and the second insulating film 16b are integrated into an insulating film 16. In the insulating film 16, the reflective film 19 and the barrier metal layer 30 are formed so as to be buried in regions facing the n-electrode 17 and the p-electrode 18 to be formed later in plan view (regions light-blocked by the n-electrode 17 and the p-electrode 18). Thereafter, holes 20 to expose the contact electrodes 31 and holes 21 to expose the contact electrodes 32 are formed on specific regions of the insulating film 16.

Figure 12G:
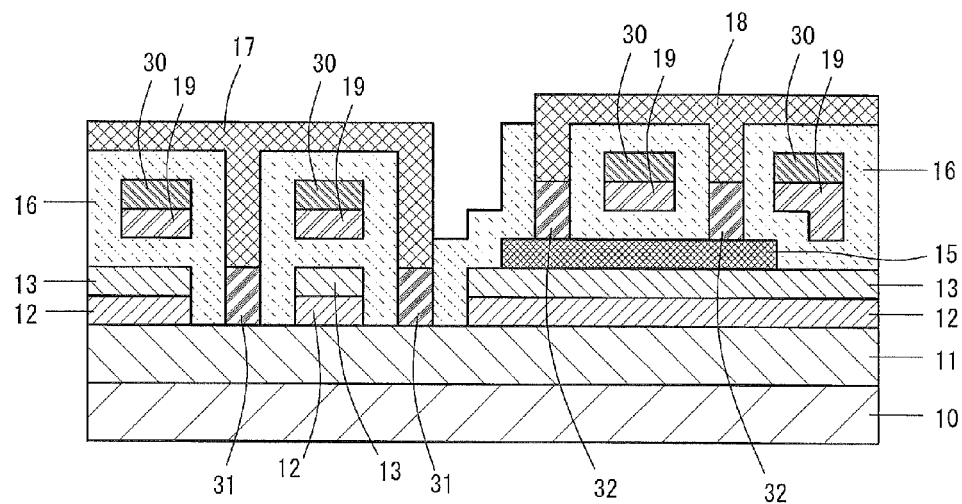
FIG. 12G A sketch showing a process for producing the Group III nitride semiconductor light-emitting device according to Embodiment 5.

Then, as shown in FIG. 12G, an n-electrode 17 and a p-electrode 18 of Ni/Au/Al are formed by vapor deposition on the insulating film 16. The n-electrode 17 and the p-electrode 18 may be separately formed or may be simultaneously formed using the same material. The n-electrode 17 is, as shown in FIG. 4, formed in a shape having a pad portion 17a and a wiring portion 17b, and the holes 20 are filled with a portion of the wiring portion 17b so that the wiring portion 17b is in contact with the contact electrode 31. The p-electrode 18 is, as shown in FIG. 4, formed in a shape having a pad portion 18a and a wiring portion 18b, and the holes 21 are filled with a portion of the wiring portion 18b so that the wiring portion 18b is in contact with the contact electrode 32.

Figure 12H:
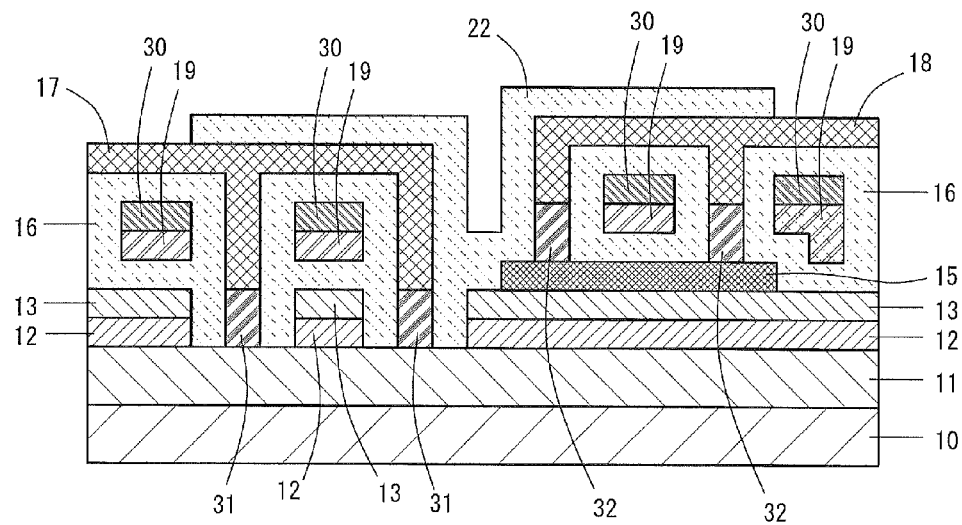
FIG. 12H A sketch showing a process for producing the Group III nitride semiconductor light-emitting device according to Embodiment 5.

Subsequently, as shown in FIG. 12H, an insulating film 22 is formed on the entire surface except for the pad portion 17a of the n-electrode 17 and the pad portion 18a of the p-electrode 18, thereby producing the Group III nitride semiconductor light-emitting device according to Embodiment 5 shown in FIGS. 4 and 11.

In the above Embodiment 5, as in Embodiment 2, when the second insulating film 16b, the n-electrode 17, and the p-electrode 18 were formed as shown in FIG. 12G, the heat treatment may be performed within a range of 300° C. to 700° C. (preferably, 300° C. to 600° C.).

In the above mentioned method for producing the Group III nitride semiconductor light-emitting device according to Embodiment 5, Al/Ag/Al where Al has a thickness of 1 Å to 30 Å is used as a material of the reflective film 19, and the heat treatment is performed within a temperature range of 300° C. to 700° C. (preferably, 300° C. to 600° C.) before forming the barrier metal layer 30 on the reflective film 19 after the formation of the reflective film 19. Therefore, the reflectance of the reflective film 19 is equivalent to or higher than that of the single Ag layer even after the heat treatment. The heat treatment within a range of 300° C. to 600° C. can increase the reflectance of the reflective film more than that before the heat treatment. Therefore, the Group III nitride semiconductor light-emitting device according to Embodiment 5 exhibits superior light extraction performance. This heat treatment also can achieve an ohmic contact with the contact electrodes 31 and 32. Since Ag of the reflective film 19 is not in direct contact with the insulating film 16, the adhesion between the reflective film 19 and the insulating film 16 is ensured, and the reliability of the Group III nitride semiconductor light-emitting device can also be improved.

INDUSTRIAL APPLICABILITY

The Group III nitride semiconductor light-emitting device produced by the method of the present invention can be employed in, for example, an illumination apparatus.

DESCRIPTION OF THE REFERENCE NUMERALS

10: Sapphire substrate
11: n-GaN layer
12: Light-emitting layer
13: p-GaN layer
14, 20, 21: Hole
15: ITO electrode
16, 120: Insulating film
17: n-electrode
18: p-electrode
30: Barrier metal layer
31, 32: Contact electrode
19, 119: Reflective film
121: Solder layer

The invention claimed is:

1. A method for producing a Group III nitride semiconductor light-emitting device comprising a reflective film in contact with and on a first insulator,
wherein the Group III nitride semiconductor light-emitting device includes an n-type layer, a light-emitting layer, a p-type layer, and a diffusion electrode to diffuse a current to the p-type layer,
wherein the reflective film comprises an at least three-layer structure by forming a third layer of Al having a thickness of 1 Å to 30 Å directly contacted with and on the first insulator, and forming a first layer of Ag directly contacted with and on the third layer, and forming a second layer of Al having a thickness of 1 Å to 30 Å directly contacted with and on the first layer,
wherein a first contact electrode is formed in contact with the n-type layer and a second contact electrode is formed in contact with the diffusion electrode, respectively,
wherein heat treatment is performed at a temperature of 300° C. to 700° C. with a top surface of the reflective film exposed after formation of the reflective film, to form an ohmic contact between the first contact electrode and the n-type layer, between the second contact electrode and the diffusion electrode, and between the diffusion electrode and the p-type layer,
wherein a second insulator is formed over the reflective film after the heat treatment, and
wherein a reflectance of the reflective film is equivalent to or higher than a reflectance of a single Ag layer before the heat treatment.

2. The method for producing a Group III nitride semiconductor light-emitting device according to claim 1, wherein the first contact electrode and the second contact electrode are formed before the formation of the reflective film.

3. The method for producing a Group III nitride semiconductor light-emitting device according to claim 2, wherein a barrier metal layer is formed on the reflective film to prevent diffusion of Ag.

4. The method for producing a Group III nitride semiconductor light-emitting device according to claim 1, wherein a barrier metal layer is formed on the reflective film to prevent diffusion of Ag.

5. The method for producing a Group III nitride semiconductor light-emitting device according to claim 1, wherein the Group III nitride semiconductor light-emitting device comprises a flip-chip type light-emitting device in which a device structure is formed on a substrate, and the reflective film is formed via the first insulator on the device structure.

6. The method for producing a Group III nitride semiconductor light-emitting device according to claim 1, wherein the Group III nitride semiconductor light-emitting device has a peak emission wavelength of 400 nm or more.

7. The method for producing a Group III nitride semiconductor light-emitting device according to claim 1, wherein the reflective film comprises a five-layer structure by forming a fourth layer of Ag directly contacted with and on the second layer, and forming a fifth layer of Al having a thickness of 1 Å to 30 Å directly contacted with and on the fourth layer.

8. The method for producing a Group III nitride semiconductor light-emitting device according to claim 1, wherein the Group III nitride semiconductor light-emitting device comprises a device structure formed on a substrate, the reflective film being disposed on a bottom surface of the substrate of the device structure.

9. The method for producing a Group III nitride semiconductor light-emitting device according to claim 1, wherein the Group III nitride semiconductor light-emitting device comprises a face-up type in which an electrode is formed in a wiring pattern on the second insulator, and light is extracted from an electrode side, and wherein, in a plan view, the reflective film is formed in regions under the electrode.

10. The method for producing a Group III nitride semiconductor light-emitting device according to claim 1, wherein Ag of the first layer is passivated by Al of the second layer through the heat treatment.

11. The method for producing a Group III nitride semiconductor light-emitting device according to claim 1, wherein Ag of the first layer is not passivated by Al of the third layer.

12. A method for producing a Group III nitride semiconductor light-emitting device, comprising a reflective film in contact with and on a first insulator,
wherein the Group III nitride semiconductor light-emitting device includes an n-type layer, a light-emitting layer, a p-type layer, and a diffusion electrode to diffuse a current to the p-type layer,
wherein the reflective film includes an at least three-layer structure by forming a third layer of Al having a thickness of 1 Å to 30 Å directly contacted with and on the first insulator, and forming a first layer of Ag directly contacted with and on the third layer, and forming a second layer of Al having a thickness of 1 Å to 30 Å directly contacted with and on the first layer,
wherein a first contact electrode is formed in contact with the n-type layer and a second contact electrode is formed in contact with the diffusion electrode, respectively,
wherein a second insulator is formed over the reflective film, and heat treatment is performed at a temperature of 300° C. to 700° C. after the formation of the second insulator, to also form an ohmic contact between the first contact electrode and the n-type layer, between the second contact electrode and the diffusion electrode, and between the diffusion electrode and the p-type layer, and
wherein a reflectance of the reflective film is equivalent to or higher than a reflectance of a single Ag layer before the heat treatment.

13. The method for producing a Group III nitride semiconductor light-emitting device according to claim 12, wherein the first contact electrode and the second contact electrode are formed before the formation of the reflective film.

14. The method for producing a Group III nitride semiconductor light-emitting device according to claim 12, wherein a barrier metal layer is formed on the reflective film to prevent diffusion of Ag.

15. The method for producing a Group III nitride semiconductor light-emitting device according to claim 13, wherein a barrier metal layer is formed on the reflective film to prevent diffusion of Ag.

16. The method for producing a Group III nitride semiconductor light-emitting device according to claim 12, wherein the Group III nitride semiconductor light-emitting device is of a face-up type in which an electrode is formed in a wiring pattern on the second insulator, and light is extracted from an electrode side, and wherein the reflective film is formed in regions under the electrode in a plan view.

17. The method for producing a Group III nitride semiconductor light-emitting device according to claim 12, wherein the Group III nitride semiconductor light-emitting device is of a face-up type in which a substrate is the first insulator, and a device structure is formed thereon, and wherein the reflective film is formed on a surface opposite to a surface of the substrate on which the device structure is formed.

18. The method for producing a Group III nitride semiconductor light-emitting device according to claim 12, wherein the Group III nitride semiconductor light-emitting device comprise a flip-chip type light-emitting device in which a device structure is formed on a substrate, and the reflective film is formed via the first insulator on the device structure.

19. The method for producing a Group III nitride semiconductor light-emitting device according to claim 12, wherein the reflective film comprises a five-layer structure by forming a fourth layer of Ag directly contacted with and on the second layer, and forming a fifth layer of Al having a thickness of 1 Å to 30 Å directly contacted with and on the fourth layer.

20. The method for producing a Group III nitride semiconductor light-emitting device according to claim 12, wherein Ag of the first layer is passivated by Al of the second layer through the heat treatment.

* * * * *